United States Patent
Kuroda

(10) Patent No.: US 7,349,267 B2
(45) Date of Patent: Mar. 25, 2008

(54) SEMICONDUCTOR MEMORY DEVICE

(75) Inventor: Naoki Kuroda, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/492,176

(22) Filed: Jul. 25, 2006

(65) Prior Publication Data

US 2007/0025171 A1    Feb. 1, 2007

(30) Foreign Application Priority Data

Jul. 27, 2005    (JP)    ............................. 2005-217770

(51) Int. Cl.
*G11C 7/00*    (2006.01)

(52) U.S. Cl. ................. 365/189.09; 365/203; 365/231; 365/230.06

(58) Field of Classification Search ........... 365/189.09, 365/189.01, 231, 203, 230.06
See application file for complete search history.

(56) References Cited

U.S. PATENT DOCUMENTS

| | | | |
|---|---|---|---|
| 6,373,745 B2 | 4/2002 | Saito et al. | |
| 6,496,417 B1 * | 12/2002 | Shiau et al. | ............. 365/185.2 |
| 7,099,199 B2 * | 8/2006 | Seki et al. | ............. 365/185.29 |
| 2003/0002347 A1 * | 1/2003 | Seki et al. | ............. 365/185.29 |
| 2004/0125681 A1 | 7/2004 | Yamaoka et al. | |

FOREIGN PATENT DOCUMENTS

JP    2003-031749    1/2003

* cited by examiner

*Primary Examiner*—Thong Q. Le
(74) *Attorney, Agent, or Firm*—McDermott Will & Emery LLP

(57) ABSTRACT

In a memory cell array, source lines are provided so that each of the source lines is connected to ones of memory cells which belong to adjacent two rows and a plurality of source bias control circuits for supplying a source bias potential which is higher than a ground potential and lower than a power supply potential are provided so as to correspond to the source lines, respectively. In an active period, the source bias control circuits perform potential control so that one or more of the source lines selected by row predecoders which are not connected to one of the memory cells which is to be read out are controlled to be in a state where the source bias potential is supplied.

27 Claims, 11 Drawing Sheets

SEMICONDUCTOR MEMORY DEVICE

CROSS-REFERENCE TO RELATED APPLICATION

The disclosure of Japanese Patent Application No. 2005-217770 filed on Jul. 27, 2005 including specification, drawings and claims are incorporated herein by reference in its entirety.

BACKGROUND OF THE INVENTION

1. Field of the Invention

The present invention relates to a semiconductor memory device such as a mask ROM (read only memory), and more particularly relates to a circuit technique which achieves increase in size and reduction in power consumption for memory cell arrays.

2. Description of the Prior Art

As a read only memory, for example, a contact-type mask ROM has been known. A contact-type mask ROM is a semiconductor memory device which stores data of "0" or "1" according to whether or not a drain of a memory cell transistor constituting a memory cell is connected to a bit line.

In the contact-type mask ROM, the number of memory cells per bit line is increased, thereby realizing increase in the size of a memory cell array. Therefore, suppression of a current steadily generated by an OFF leakage current of a memory cell has been required.

A semiconductor memory device 900 is an example of a contact mask ROM formed so as to have a configuration in which an OFF leakage current is reduced. The semiconductor memory device 900 is so configured that in reading data, a potential difference between a source and a drain in a non-selected memory cell is reduced by making a potential of a source line which is not connected to a memory cell from which data is to be read out be the same potential as a precharge potential of a bit line to reduce an OFF leakage current (see, for example, Japanese Laid-Open Publication No. 2003-31749).

FIG. 10 is a block diagram illustrating a configuration of the semiconductor memory device 900. As shown in FIG. 10, the semiconductor memory device 900 includes a plurality of memory cell arrays 910, a source potential control circuit 920, a plurality of column decoders 930, a plurality of precharge transistors 940, a plurality of read out circuits 950 and an output selection circuit 960.

Each of the memory cell arrays 910 includes a plurality of memory cells 911 in a matrix of n rows and m columns. In each of the memory cell arrays 910, word lines (WL0 through WLn−1) and source lines (SN0 through SNn−1) are provided so as to correspond to the rows of the matrix, respectively. Also, in each of the memory cell arrays 910, bit lines (BL00 through BL1m−1) are provided so as to correspond to the columns, respectively.

Each of the memory cells 911 is specifically formed of a transistor. A gate of each of the memory cells (transistors) 911 is connected to one of the word lines corresponding to one of the rows to which one of the memory cells 911 belongs. A source node of each of the memory cells 911 is connected to one of the source lines corresponding to one of the columns to which one of the memory cells 911 belongs. Each of the memory cells 911 stores data of "0" or "1" according to whether or not a drain is connected to one of the bit lines corresponding to one of the columns to which one of the memory cells 911 belongs.

The source potential control circuit 920 includes a plurality of NOT circuits 921 provided so as to correspond to the word lines, respectively. Each of the NOT circuits 921 supplies a signal, obtained by inversion of a level of an associated one of the word lines, to an associated one of the source lines. For example, a signal obtained by inversion of a word line WL0 is supplied to a source line SN0.

Each of the column decoders 930 includes a plurality of switches provided so as to correspond to the bit lines, respectively. The switches receive column selection signals CA0 through CAm−1 indicating which bit line to be selected, respectively. One of the switches connects one of the bit lines which is to be selected to an associated one of the precharge transistors 940 and an associated one of the read out circuits 950.

Each of the precharge transistors 940 precharges an associated one of the bit lines connected to the precharge transistor 940 via an associated one of the column decoders 930 according to a precharge signal (PCLK0 or PCLK1).

Each of the read out circuits 950 reads data output to an associated one of the bit lines connected thereto via an associated one of the column decoders 930 and outputs the data to the output selection circuit 960.

The output selection circuit 960 selects one of two data (SOUT1 and SOUT2) read out by two of the read out circuits 950 according to a selection signal SEL and outputs the selected data.

The operation of the semiconductor memory device 900 formed so as to have the above-described configuration when data is read out from one of the memory cells connected to the word line WL0 will be described with reference to a timing chart shown in FIG. 28.

When the semiconductor memory device 900 is in a stand-by state before a time A, in the semiconductor memory device 900, each of the word lines is the Low (L) level, so that the source lines are all kept at the High (H) level.

For example, when the column selection signal CAm−1 is deactivated in response to a read out request received from the outside at the time A, one of the switches which has received the column selection signal CA0 is turned ON. Thus, a bit line BL00 is connected to an associated one of the precharge transistors 940 and an associated one of read out circuits 950. Next, when the precharge signal PCLK0 is activated and then one of the precharge transistors 940 is turned ON, only the bit line BL00 is precharged to be the H level.

When the selected word line WL0 is activated, a source line SN0 is pulled down to the L level. In this case, the other ones of the source lines than the source line SN0 stay at the H level. In one of the memory cells activated by the word line WL0, when a drain is connected to the bit line BL00, the bit line BL00 is pulled down to the L level. If the drain is not connected to the bit line BL00, the bit line BL00 is kept to be in a state where the bit line BL00 is precharged to the H level.

Next, data (signal) of the bit line BL00 is read out by an associated one of the read out circuits 950. An output signal SOUT0 of the read out circuit 950 is latched at a rise timing of the selection signal SEL and is output as an output DOUT to the outside of the semiconductor memory device 900.

Thereafter, when the word line WL0 returns to the L level, a source node of one of the memory cells 911 connected to the word line WL0 becomes the H level.

As has been described, in the semiconductor memory device 900, when a read out request is received, only one of the source lines connected to selected one of the memory cells is pulled down to the L level, so that an OFF leakage current can be suppressed due to a reverse bias effect in the other ones of the memory cells which are not selected. The OFF leakage current suppression is useful for achieving increase in size of memory cells.

However, in the above-described configuration, since the source lines and the word lines are provided in the one-to-one correspondence, a problem arises in which as a memory capacity is increased, a layout area is increased because of the arrangement of the source lines.

Moreover, when the semiconductor memory device 900 is in a stand-by state, all of respective source nodes of memory cells are kept to be in the H level. Thus, as a memory capacity is increased, while reduction in size is achieved, an OFF leakage current in a memory cell is increased. Accordingly, in the semiconductor memory device as a whole, power consumption tends to be increased.

To suppress an OFF leakage current, a voltage of each source node is preferably 0.1 through 0.2 V (specifically, in the 65 nm process, if a source node voltage is increased by 0.1 V, an OFF leakage current can be suppressed so as to be two orders in magnitude smaller). However, in the known configuration, the source node voltage is increased to the VDD level or the VDD-Vtn (Vtn is a threshold potential of an n-channel transistor constituting a memory cell). That is, there has been a problem in which more power than necessary for suppressing an OFF leakage current is consumed.

SUMMARY OF THE INVENTION

In view of the above-described problems, the present invention has been devised and it is therefore an object of the present invention to provide a semiconductor memory device which achieves reduction in power consumption during a stand-by period and an operation period and increase in size of a memory capacity at the same time.

To solve the above-described problem, a first aspect of the present invention is directed to a semiconductor memory device which includes a memory cell array in which memory cells are arranged in a matrix, each said memory cell being formed of a single transistor. The semiconductor memory device of the first aspect is characterized by including: a plurality of word lines provided so as to correspond to rows in the matrix, respectively, each said word line being connected in common to respective gate terminals of transistors located in an associated one of the rows; a plurality of bit lines provided so as to correspond to columns in the matrix, respectively, each said bit line being connected to at least one of respective drain terminals of transistors located in an associated one of the columns; a plurality of source lines provided so that each said source line corresponds to every adjacent two rows in the matrix and is connected in common to respective source terminals of transistors located in the two rows; a plurality of source bias control circuits for controlling, in an active period in which an operation of reading data from the memory cells, according to a row selection signal for selecting one or more of the source lines which are to be controlled, one or more of the source lines which are not connected to one of the memory cells which is to be read out to be in a state where a source bias potential that is higher than a ground potential and lower than a power supply potential; and a source line selection circuit for selecting said one of the source lines which is to be read out and generating the row selection signal.

Thus, potentials of one or more of the source lines are selectively controlled so that OFF leakage currents are prevented due to a reverse bias effect. Specifically, the number of one or more of the source lines which are to be controlled so that the balance between reduction in power consumption due to a reverse bias effect and increase in power consumption resulting from supply of potentials to one or more of the source lines. Therefore, power consumption of the semiconductor memory device as a whole can be reduced.

According to a second aspect of the present invention, the semiconductor memory device of the first aspect is characterized in that each said the source bias control circuit is configured so as to selectively perform control of the source lines by a predecode signal that is the row selection signal.

Thus, one or more of the source lines which are to be potential-controlled are selected on the basis of the predecode signal.

According to a third aspect of the present invention, the semiconductor memory device of the first aspect is characterized in that the semiconductor memory device further includes a temperature detector circuit for detecting change in temperature of the semiconductor memory device, and the source line selection circuit is configured so as to select, according to the change in temperature detected by the temperature detector circuit, said one or more of the source lines which are to be controlled.

Thus, one or more of the source lines which are to be potential-controlled are selected according to the temperature of the semiconductor memory device.

According to a fourth aspect of the present invention, the first semiconductor memory device of the first aspect is characterized in that the source line selection circuit is configured so as to select, according to control externally performed from the outside of the semiconductor memory device, said one or more of the source lines which are to be controlled.

Thus, one or more of the source lines which are to be potential-controlled are selected according to control of the outside of the semiconductor memory device.

According to a fifth aspect of the present invention, the semiconductor memory device of the first aspect is characterized in that the semiconductor memory device further includes a plurality of source pull down drivers for pulling, when one or more of the source lines to which the source bias potential is supplied are pulled back to the ground potential, one or more of the source lines which are to be pulled back to the ground potential, and the source pull down drivers are dispersedly arranged in a word line direction in the memory cell array.

According to a sixth aspect of the present invention, the semiconductor memory device of the fifth aspect is characterized in that the source pull down drivers are arranged so that one of the source pull down drivers is provided for each memory cell array corresponding to a minimum output unit for data read out from the memory cells.

According to a seventh aspect of the present invention, the semiconductor memory device of the fifth aspect is characterized in that each said source pull down driver is configured so as to pull down said one or more of the source lines according to respective potentials of the word lines.

Thus, potentials of the source lines can be pulled down from the source bias potential to the ground potential at higher speed. Moreover, each of the source pull down drivers is arranged so as to be separated from each of the source bias control circuits. Therefore, even in a semiconductor memory device having a large capacity and a large source line length, the dependency of a speed at which the source lines are pulled back to the ground potential on a location can be reduced.

An eighth aspect of the present invention is directed to a semiconductor memory device which includes a memory cell array in which memory cells are arranged in a matrix, each said memory cell being formed of a single transistor. The semiconductor memory device of the eighth aspect is characterized by including: a plurality of word lines provided so as to correspond to rows in the matrix, respectively, each said word line being connected in common to respective gate terminals of transistors located in an associated one of the rows; a plurality of bit lines provided so as to correspond to columns in the matrix, respectively, each said bit line being connected to at least one of respective drain terminals of transistors located in an associated one of the columns; a plurality of source lines provided so that each said source line corresponds to every adjacent two rows in the matrix and is connected in common to respective source terminals of transistors located in the two rows; a plurality of source bias control circuits for controlling, in an active period in which an operation of reading data from the memory cells, according to a row selection signal for selecting one or more of the source lines which are to be controlled, one or more of the source lines which are not connected to one of the memory cells which is to be read out to be in one of a state where a source bias potential that is higher than a ground potential and lower than a power supply potential, a state where the ground potential is supplied and a high impedance state; and a source line selection circuit for selecting said one of the source lines which is to be read out and generating the row selection signal.

According to a ninth aspect of the present invention, the semiconductor memory device of the eighth aspect is characterized in that each said the source bias control circuit is configured so as to perform, according to a selection signal received from the outside of the semiconductor memory device, potential control to said one or more of the source lines to be in one of the three states.

According to a tenth aspect of the present invention, the semiconductor device of the eighth aspect is characterized in that a value of data to be stored in each said the memory cell is determined on the basis of whether or not each said memory cell is connected to one of the bit lines to which the respective drain terminals of transistors are connected, and each said source bias control circuit is configured so that when a contact layer based on which the value of data is determined is formed, which one of the three states is determined as a target state of potential-control for said one or more of the source lines.

Thus, one or more of the source lines which are to be controlled are potential-controlled to one of the three states, i.e., the state where the source bias potential is supplied, the state where the ground potential is supplied and the high impedance state.

According to an eleventh aspect of the present invention, the semiconductor memory device of the first aspect of the semiconductor device is characterized in that the semiconductor memory device further includes: a plurality of bit line precharge circuits for precharging the bit lines according to a precharge signal indicating a period for precharge; a command decoder circuit for outputting, at a timing corresponding to a memory access request from the outside of the semiconductor memory device, an active signal indicating an active period in which the semiconductor memory device is in an operation of reading out data from one of the memory cells and resetting the active signal at its own timing; and a precharge signal generator circuit for generating the precharge signal, and each said source bias control circuit is configured so as to control, in the precharge period indicated by the precharge signal or in the active period indicated by the active signal, said one or more of the source lines which are not connected to said one of the memory cells which is to be read out to be in the state where the source bias potential is supplied.

According to a twelfth aspect of the present invention, the semiconductor memory device of the eleventh aspect is characterized in that the semiconductor memory device further includes: a dummy memory cell array including ones of the memory cells located in a single column; a dummy bit line used for connecting respective drain terminals of transistors constituting said ones of the memory cells, respectively, in the dummy cell array; and a dummy precharge circuit for precharging the dummy bit line, and the precharge signal generator circuit is configured so as to reset the precharge signal when a potential of the dummy bit line exceeds a predetermined level.

According to a thirteenth aspect of the present invention, the semiconductor memory device of the twelfth aspect is characterized in that the dummy memory cell array is provided for each memory cell array corresponding to a minimum output unit for data read out from the memory cells, and a load carrying capacity of the dummy bit line is adjusted according to whether or not at least one of the memory cells is connected to the dummy bit line or whether or not all of the memory cells are connected to the dummy bit line.

According to a fourteenth aspect of the present invention, the semiconductor memory device of the twelfth aspect is characterized in that a value of data to be stored in each said the memory cell is determined on the basis of whether or not each said memory cell is connected to one of the bit lines to which the respective drain terminals of transistors are connected, and the dummy memory cell array is configured so that when a contact layer based on which the value of data is determined is formed, the number of the dummy memory cell array and the number of ones of the memory cells which are to be connected to the dummy bit line in the dummy memory cell array are set.

According to a fifteenth aspect of the present invention, the semiconductor memory device of the thirteenth aspect is characterized in that a value of data to be stored in each said the memory cell is determined on the basis of whether or not each said memory cell is connected to one of the bit lines to which the respective drain terminals of transistors are connected, and the dummy memory cell array is configured so that when a contact layer based on which the value of data is determined is formed, the number of the dummy memory cell array and the number of ones of the memory cells which are to be connected to the dummy bit line in the dummy memory cell array are set.

Thus, in a precharge period, the source lines can be set to be the source bias potential, so that an operation problem due to an OFF leakage current in an active period can be solved.

According to a sixteenth aspect of the present invention, the semiconductor memory device of the twelfth aspect is characterized in that a plurality of pairs of the dummy memory cell array and the dummy precharge circuit are provided, and each of the plurality of dummy precharge circuits in the pairs is configured so as to have a different precharge speed for precharging the dummy bit line.

According to a seventeenth aspect of the present invention, the semiconductor memory device of the thirteenth aspect is characterized in that a plurality of pairs of the dummy memory cell array and the dummy precharge circuit are provided, and each of the plurality of dummy precharge circuits in the pairs is configured so as to have a different precharge speed for precharging the dummy bit line.

According to an eighteenth aspect of the present invention, the semiconductor memory device of the sixteenth aspect is characterized by further including a plurality of column switch circuits for activating one of the pairs of the dummy memory cell array and the dummy precharge circuit according to control from the outside of the semiconductor memory device.

According to an nineteenth aspect of the present invention, the semiconductor memory device of the seventeenth aspect is characterized by further including a plurality of column switch circuits for activating one of the pairs of the dummy memory cell array and the dummy precharge circuit according to control from the outside of the semiconductor memory device.

According to a twenties aspect of the present invention, the semiconductor memory device of the sixteenth aspect is characterized in that a value of data to be stored in each said the memory cell is determined on the basis of whether or not each said memory cell is connected to one of the bit lines to which the respective drain terminals of transistors are connected, and the dummy memory cell array is configured so that when a contact layer based on which the value of data is determined is formed, one of the pairs of the dummy memory cell array and the dummy precharge circuit is activated.

According to a twenty first aspect of the present invention, the semiconductor memory device of the seventeenth aspect is characterized in that a value of data to be stored in each said the memory cell is determined on the basis of whether or not each said memory cell is connected to one of the bit lines to which the respective drain terminals of transistors are connected, and the dummy memory cell array is configured so that when a contact layer based on which the value of data is determined is formed, one of the pairs of the dummy memory cell array and the dummy precharge circuit is activated.

Thus, a precharge period can be set to have an appropriate length.

According to a twenty second aspect of the present invention, the semiconductor memory device of the first aspect is characterized in that the semiconductor memory device includes: a plurality of column switches for selecting one of the bit lines according to an address indicated by a received address signal; a plurality of first precharge circuits for precharging the bit lines according to a precharge signal indicating a period for precharge by potentials supplied via the column switches, respectively; a second precharge circuit for precharging the bit lines without potentials supplied via the column switches, respectively; a command decoder circuit for outputting, at a timing corresponding to a memory access request from the outside of the semiconductor memory device, an active signal indicating an active period in which the semiconductor memory device is in an operation of reading out data from one of the memory cells and resetting the active signal at its own timing; and a precharge signal generator circuit for generating the precharge signal, and each said source bias control circuit is configured so as to control, in the precharge period indicated by the precharge signal or in the active period indicated by the active signal, said one or more of the source lines which are not connected to said one of the memory cells which is to be read out to be in the state where the source bias potential is supplied.

Thus, the bit lines can be precharged at higher speed.

According to a twenty third aspect of the present invention, the semiconductor memory device of the twenty second aspect is characterized in that the column switches, the first precharge circuits and the second precharge circuit are formed of transistors of the same type.

Thus, even when characteristics of the transistors which supply precharge potentials vary, stable precharge can be performed.

According to a twenty fourth aspect of the present invention, the semiconductor memory device of the twenty third aspect is characterized in that each of the first precharge circuits and the second precharge circuit is configured so that precharge is performed by a lower potential than the power supply potential by a threshold potential of each said transistors forming the first precharge circuits and the second precharge circuit.

Thus, power consumption can be suppressed and also high speed data read can be performed.

According to a twenty fifth aspect of the present invention, the semiconductor memory device of the twenty fourth aspect is characterized in that the threshold potential of each said transistor forming the column switches, the first precharge circuits and the second precharge circuit is higher than a threshold potential of a transistor used in some other circuit than the column switches, the first precharge circuits and the second precharge circuit in the semiconductor memory device.

Thus, a precharge voltage can be further reduced. That is, power consumption can be suppressed and also high speed data read can be performed.

DESCRIPTION OF THE PREFERRED EMBODIMENTS

Hereafter, embodiments of the present invention will be described with reference to the accompanying drawings.

First Embodiment

Figure 1:
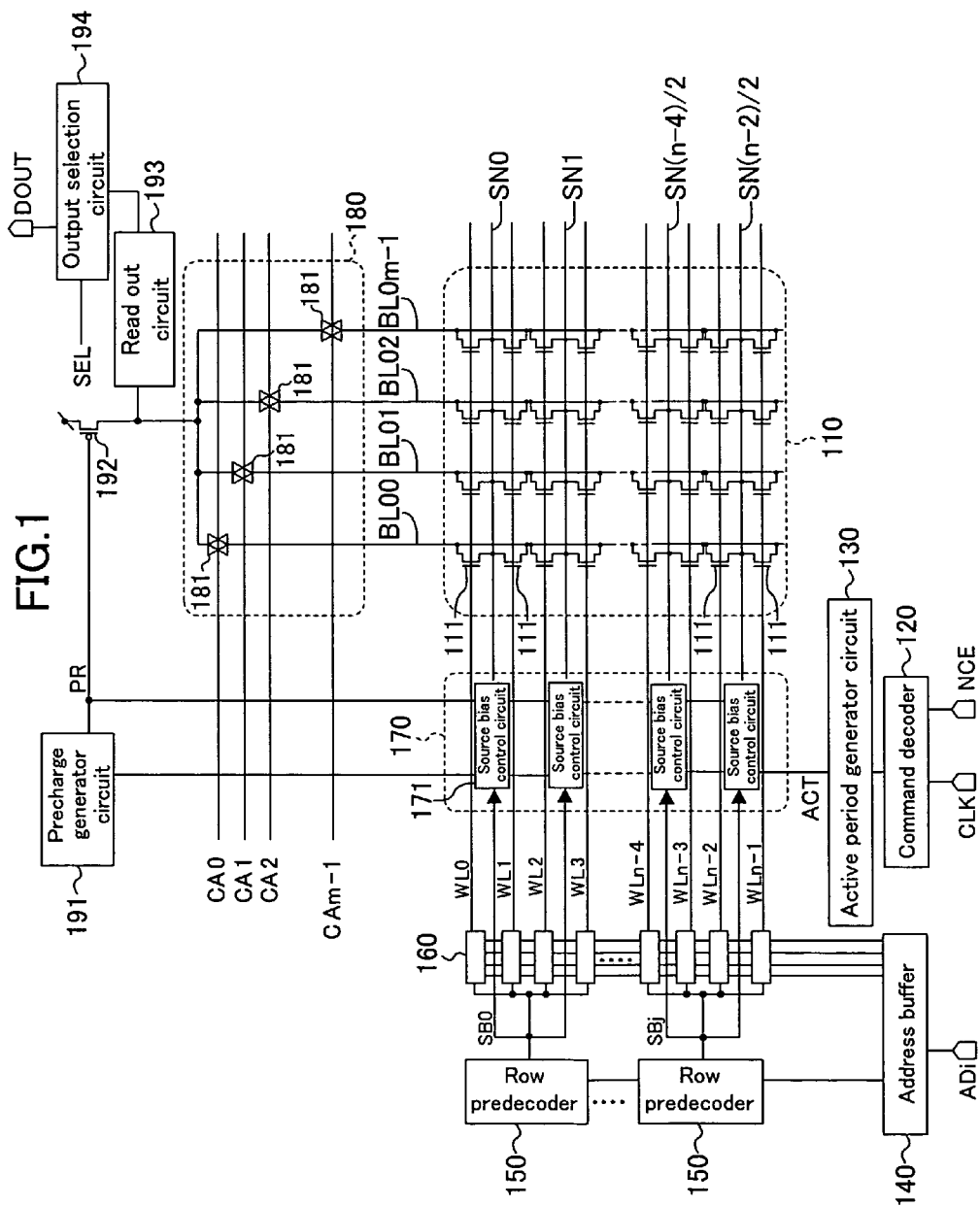
FIG. 1 is a block diagram illustrating a configuration of a semiconductor memory device according to a first embodiment of the present invention.

FIG. 1 is a block diagram illustrating a configuration of a semiconductor memory device 100 according to a first embodiment of the present invention. As shown in FIG. 1, the semiconductor memory device 100 includes a memory cell array 110, a command decoder 120, an active period generator circuit 130, an address buffer 140, a plurality of row predecoders 150, a plurality of word drivers 160, a source bias control circuit array 170, a column decoder 180, a precharge generator circuit 191, a precharge transistor 192, a read out circuit 193 and an output selection circuit 194.

The memory cell array 110 includes a plurality of memory cells 111 in a matrix of n rows and m columns.

In the memory cell array 110, word lines WL0 through WLn−1 are provided so as to correspond to the rows of the matrix, respectively. Also, in the memory cell array 110, source lines SN0 through SN(n−2)/2 are provided so that one source line is provided for every two adjacent rows of the memory cells. For example, as shown in FIG. 1, the source line SN0 is provided so as to correspond to the word lines WL0 and WL1. In the memory cell array 110, bit lines BL00 through BL0m−1 are provided so as to correspond to columns, respectively.

Each of the memory cells 111 is specifically formed of an n-channel transistor. A gate of each of the memory cells 111 (n-channel transistors) is connected to one of the word lines corresponding to one of the rows to which the memory cell belongs.

A source node of each of the memory cells 111 is connected to one of the source lines corresponding to one of the rows to which the memory cell belongs. For example, a source node of one of the memory cells 111 corresponding to the word line WL0 and a source node of another one of the memory cells 111 corresponding to the word line WL1 are connected in common to the source line SN0. That is, each source node is connected in common to respective source nodes of ones of memory cells located in adjacent two rows.

Each of the memory cells 111 stores data of "0" or "1" according to whether or not a drain thereof is connected to one of the bit lines corresponding to one of the columns to which the memory cell belongs.

The command decoder 120 outputs a signal indicating that an active period (a period in which an operation of reading out data from one of the memory cells is performed) is started to the active period generator circuit 130 according to an external signal NCE received from the outside of the semiconductor memory device 100 and an external clock signal CLK which is to be a reference of the operation of the semiconductor memory device 100.

The active period generator circuit 130 detects a start of an active period on the basis of an output of the command decoder 120 and generates a memory activation signal ACT indicating that an active period is started for a certain period. In this embodiment, description is made on the assumption that the memory activation signal ACT is turned to a High level during an active period.

The address buffer 140 outputs an address signal ADi received from the outside to the row predecoders 150 and the word drivers 160.

Each of the row predecoders 150 outputs a predecode signal obtained by decoding some digits in an address indicated by the address signal ADi output by the address buffer 140 to an associated one of the word drivers 160 and an associated one of source bias control circuits 171. The predecode signal output to each of the word drivers 160 is used for activating one of word lines WL0 through WLn−1. As will be described later, the predecode signal (SB0 . . . SBj) output to each of the source bias control circuit 171 is used for determining which source line is to be potential-controlled.

Each of the word drivers 160 activates one of the word lines corresponding to the address signal output by the address buffer 140 and the predecode signal.

In the source bias control circuit array 170, a plurality of the source bias control circuits 171 are provided so as to correspond to the source lines, respectively.

Each of the source bias control circuits 171 receives an associated one of predecode signals SB0 through SBj, and the memory activation signal ACT. Then, according to the received predecode signal and memory activation signal ACT, each of the source bias control circuits 171 controls a potential of an associated one of the source lines. Specifically, when the received predecode signal and activation signal ACT are the High level, the source bias control circuits 171 perform source line control so that one of the source lines connected to one of memory cells 111 which is to be read out becomes a VSS level (ground potential) and a source bias potential is supplied to the other ones of the memory cells 111 which are not connected to the read-out target memory cell. The source bias potential is, for example, higher than the VSS level and lower than a power supply potential. When the memory activation signal ACT is a Low level, the source lines are controlled to be the power supply potential. In the example shown in FIG. 1, a predecode signal SB0 is received by one of the source bias control circuits 171 connected to a source line SN0 and one connected to a source line SN1. Accordingly, when the source lines SN0 and SN1 are not connected to one of the memory cells 111 which is to be read out, the same potential control is performed to the source lines SN0 and SN1.

The column decoder 180 includes a plurality of column switches 181 provided so as to correspond to the bit lines, respectively, to connect the bit lines corresponding to column selection signals CA0 through CAm−1, respectively, to the precharge transistor 192. Each of the column switches 181 is specifically formed of, for example, an n-channel transistor.

In response to the memory activation signal ACT, the precharge generator circuit 191 outputs a precharge signal PR for controlling precharge of the bit lines.

When the precharge signal PR is the Low level, the precharge transistor 192 precharges one of the bit lines connected to the precharge transistor 192 via the column decoder 180.

The read out circuits 193 reads out data output to one of the bit lines selected by the column decoder 180 and outputs the data to the output selection circuit 194.

The output selection circuit 194 outputs an output of the read out circuit 193 to the outside of the semiconductor memory device at a rise timing of a received output selection signal SEL.

When the semiconductor memory device 100 is in a stand-by state (a state in which the semiconductor memory device 100 waits for a memory access request), the memory activation signal ACT is the Low level. Accordingly, all of the source lines are controlled to be a ground potential.

When the semiconductor memory device 100 is in an active period (which is a period in which the operation of reading data from a memory cell is performed), the memory cell activation signal ACT becomes the High level. Then, when one of the predecode signals becomes the High level according to an accessed address, one of the source bias control circuits 171 which has received the predecode signal of the High level supplies the source bias potential to an associated one of the source lines. In the associated one of the source lines to which the source bias potential has been supplied, an OFF leakage current can be reduced due to a reverse bias effect As has been described, according to this embodiment, based on the predecode signals, respective potentials of one or more of the source lines are selectively controlled. That is, the number of the source lines which are to be potential-controlled can be adjusted so that reduction in power consumption resulting from prevention of OFF leakage by a reverse bias effect and increase in power consumption due to a potential supply to the source lines are optimally balanced. Therefore, power consumption of the semiconductor memory device as a whole can be reduced.

Considering the relationship between an operation margin of each memory and a reverse bias effect, a single cycle of bias control of the source lines can be performed for each decode unit other than for each predecode unit.

First Modified Example of First Embodiment

Figure 2:
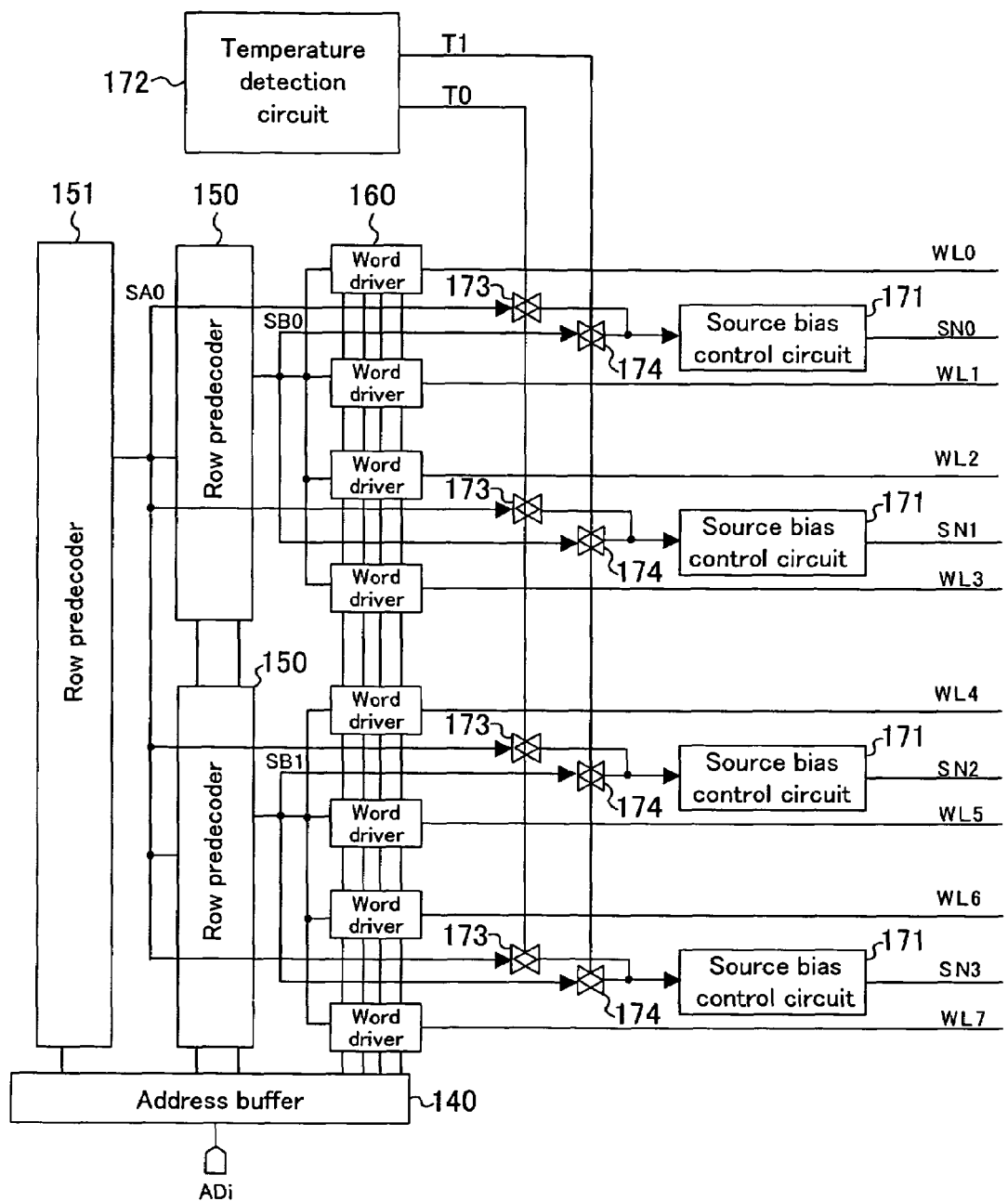
FIG. 2 is a block diagram illustrating a configuration of a semiconductor memory device according to a first modified example of the first embodiment of the present invention.

An example in which a unit for bias control of source lines is changed according to a temperature of a semiconductor memory device. To make it possible to change a unit for bias control of source lines according to a temperature, as shown in FIG. 2, a row predecoder 151, a temperature detector circuit 172, and switches 173 are added to the semiconductor memory device 100 of the first embodiment. In this modified example and the following modified example, as well as the following embodiments and modified examples thereof, each component having substantially the same function as that in the first embodiment is identified by the same reference numeral and therefore the description thereof will be omitted.

The row predecoder 151 outputs a predecode signal SA0 obtained by decoding some digits in an address indicated by an address signal output by an address buffer 140. When the switches 173 is ON, the predecode signal SA0 is received by source bias control circuits 171, respectively.

According to the temperature of the semiconductor memory device, the temperature detector circuit 172 activates a temperature detection signal T0 or T1 and then outputs the activated temperature detection signal.

When the temperature detector signal T0 is activated, the switches 173 output the predecode signal SA0 to the source bias control circuits 171, respectively.

When the temperature detector signal T1 is activated, each of switches 174 outputs received one of predecode signals SB0 through SBj to an associated one of the source bias control circuits 171.

In the first modified example of the first embodiment, when a certain temperature is detected and the temperature detector signal T0 is activated, the switches 173 which have received the predecode signal SA0 are turned ON. At this time, the same potential control is performed to all of the source lines SN0 through SN3.

When the temperature signal T1 is activated, the switches 174 which have received predecode signals SB0 and the SB1 are turned ON. Thus, one potential control is performed to the source lines SN0 and SN1 as a unit and another potential control is performed the source lines SN2 and SN3 as a unit.

For example, at a high temperature, a large OFF leakage current is generated, and therefore, a source bias potential is supplied to as many source lines as possible to reduce the OFF leakage current. At a low temperature, a smaller OFF leakage current than that at a high temperature is generated. Therefore, the number of source lines to which the source bias potential is supplied is reduced to a smaller number than that at a high temperature. Thus, the relationship between an operation margin and current consumption can be further optimized.

Second Modified Example of First Embodiment

Figure 3:
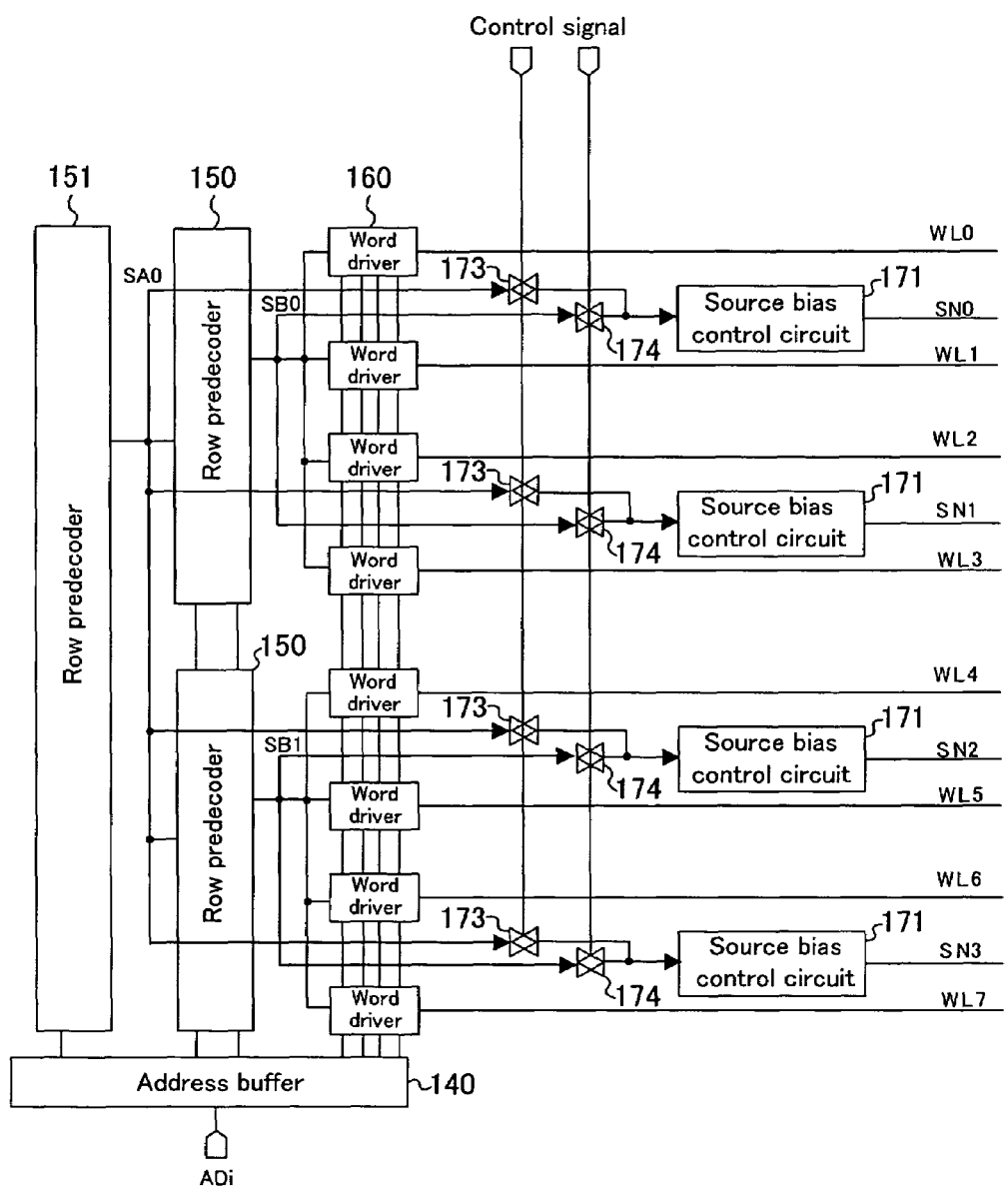
FIG. 3 is a block diagram illustrating a configuration of a semiconductor memory device according to a second modified example of the first embodiment of the present invention.

As another option, a unit for bias control of source lines may be changed according to a control signal received from the outside. Specifically, as shown in FIG. 3, according a second modified example of the first embodiment, switches 173 and switches 174 which are ON/OFF controlled by a control signal received from the outside are provided in a semiconductor memory device according to the first modified example of the first embodiment, instead of providing a temperature detector circuit 172.

Thus, for example, at a time of memory test, operation margin dependency can be evaluated, so that an optimal unit for source bias control can be understood.

Second Embodiment

Figure 4:
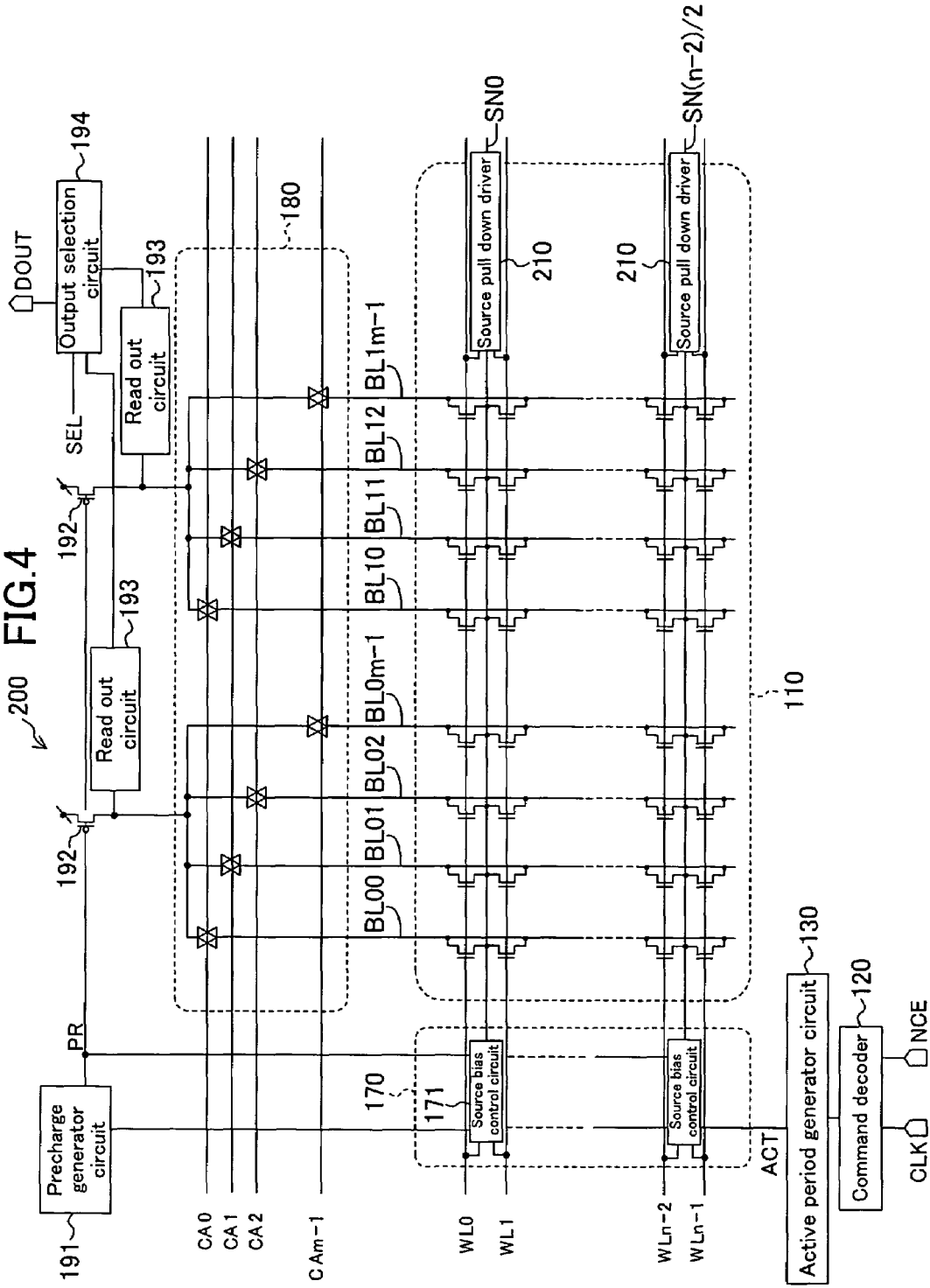
FIG. 4 is a block diagram illustrating a configuration of a semiconductor memory device according to a second embodiment of the present invention.

FIG. 4 is a block diagram illustrating a configuration of a semiconductor memory device 200 according to a second embodiment of the present invention. As shown in FIG. 4, the semiconductor memory device 200 has a configuration obtained by adding source pull down drivers 210 to the semiconductor memory device 100 of the first embodiment.

The source pull down drivers 210 are provided so as to correspond to source lines, respectively. Each of the source pull down drivers 210 pulls down an associated one of the source lines in response to respective potentials of ones of word lines corresponding to ones of memory cells located in two rows. For example, a source line SN0 is pulled down according to respective potentials of word lines WL0 and WL1. Specifically, when each of the two word lines is the Low level, an associated one of the source drivers 210 pulls down the source line.

In the second embodiment, potentials of the source lines can be pulled back from the source bias potential to a ground potential at higher speed, compared to the case where the potentials of the source lines are controlled only by source bias control circuits 171.

The source pull down drivers 210 are provided so as to be dispersedly arranged in different locations from those of the source bias control circuits 171. Therefore, even when a memory capacitance is large and also a source line length is large, the location dependency of a speed at which the potentials of the source lines are pulled back to the VSS level can be reduced. Therefore, not only high speed read out of "0" data can be maintained but also a high speed memory reset operation can be performed.

VSS power supply lines for pulling down the source lines are dispersedly arranged, so that local fluctuations of the power source lines disperse, compared to the case where the potentials of the source lines are controlled only by the source bias control circuits 171.

Since control of the source pull down drivers 210 is performed using the word lines, there is no need for providing additional interconnects for control signals of the source pull down drivers 210 in the word line direction. That is, increase in substrate area is not caused by control of the source pull down drivers 210.

The arrangement of the source pull down drivers 210 is preferably determined with an output as a unit (i.e., per memory cell array corresponding to a minimum number of the bit lines included in a signal output selection circuit). In many cases, a semiconductor memory device is designed with an output as a unit and, therefore, if the arrangement of the source pull down drivers 210 is determined with an output as a unit, semiconductor memory devices having various different output data numbers can be designed in a simple manner. That is, this technique is very effective in reduction in design time. Even if the source pull down drivers 210 are arranged so that two or more of the source pull down drivers 210 are provided per output, as long as the arrangement of the source pull down drivers 210 is designed with an output as a unit, no problem arises in terms of layout design.

If the source pull down drivers 210 are arranged so that one of the source pull down drivers 210 is located in each of substrate contact regions, a VSS line for each of the source pull down drivers 210 can be also used as a VSS power supply line for substrate bias. That is, the source pull down drivers 210 can be arranged without increasing a substrate area.

If the source pull down drivers 210 are arranged so that each of the source pull down drivers 210 has a sufficient smaller gate capacity than a gate capacity of each of memory cell transistors, the gate capacities are inconsequential for respective operation loads of the word lines.

Third Embodiment

An example of source bias control circuits for controlling source lines so that each of the source lines becomes in one of three state, i.e., a state where a source bias potential is supplied, a state where a ground potential is supplied and a high impedance state (Hi-Z state) will be described. This type of source bias control circuits can be applied to the first and second embodiments.

Figure 5:
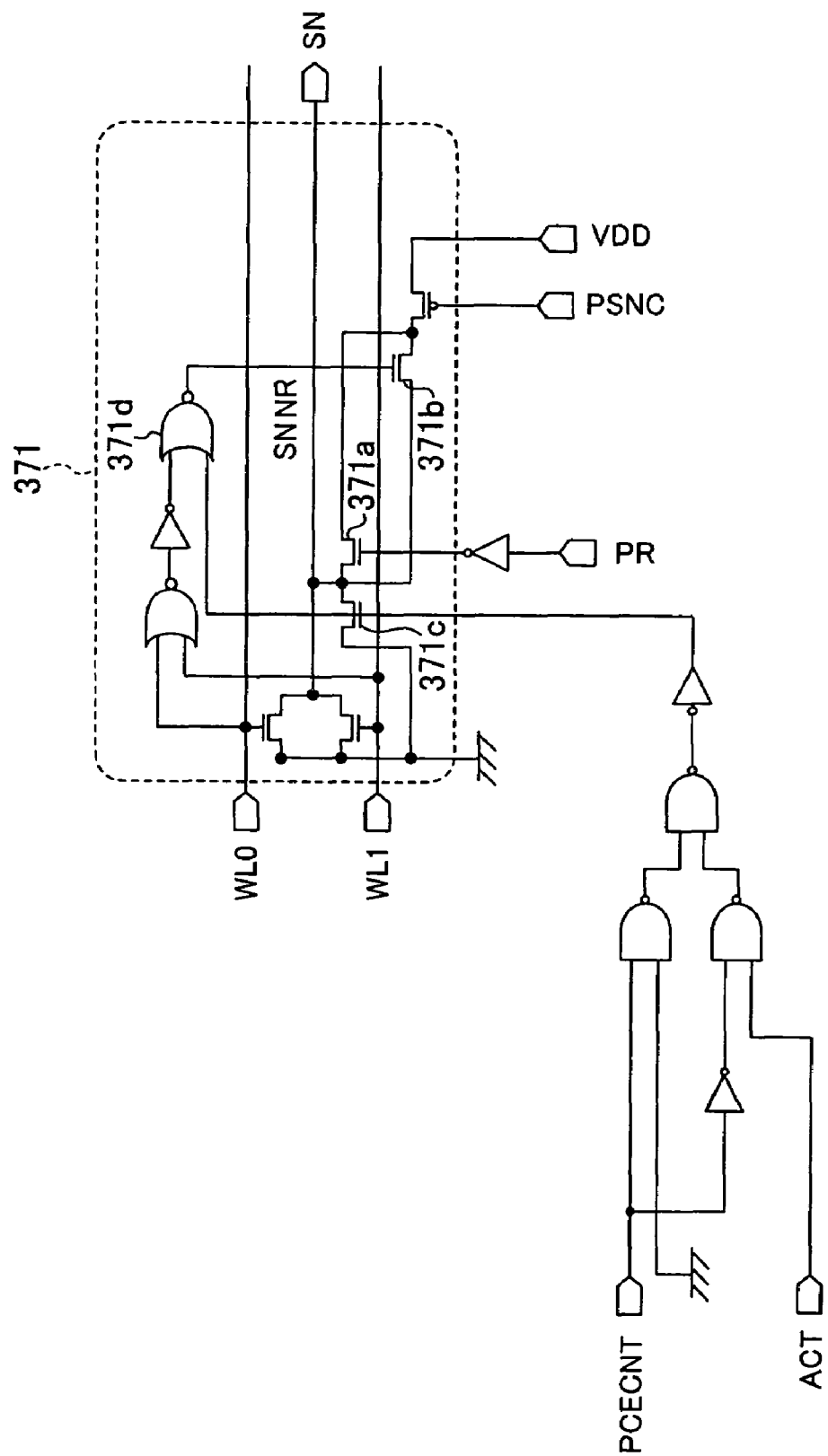
FIG. 5 is a block diagram illustrating a configuration of a source bias control circuit used in a semiconductor memory device according to a third embodiment of the present invention.

FIG. 5 is a block diagram illustrating a configuration of a source bias controls circuit 371 used in a semiconductor memory device according to a third embodiment of the present invention. In FIG. 5, a PCECNT signal is a signal for supplying a signal of the High level or an inversion signal of a memory activation signal ACT to an n-channel transistor 371c and a NOR circuit 371d. A PSNC signal is a signal for controlling a supply from a VDD power supply source to n-channel transistors 371a and 371b.

In each of the source bias control circuit 371 having the configuration shown in FIG. 5, when the PSNC signal is turned to be the High level, a supply from the VDD power supply source to the n-channel transistor 371b is cut off. Thus, a source line is fixed to a Hi-Z state or a state where the ground potential is supplied. Furthermore, the PCECNT signal is turned to be the High level, a signal of the High level is supplied to the n-channel transistor 371c and the NOR circuit 371d. Thus, the n-channel transistor 371c is turned ON and the n-channel transistor 371b is turned OFF. The source line is turned to be in a state where the ground potential is supplied. When the PSNC signal becomes the Low level, the source line is turned to be in a state where the source bias potential (of the VDD level in the example of FIG. 5) is supplied.

That is, by controlling two inputs signals, i.e., the PCECNT signal and the PSNC signal, a potential of the source line can be changed to be in one of the three states, i.e., a state where the source bias potential is supplied, a Hi-Z state, or a state where the ground potential is supplied. This means that in a large capacity memory, an optimal condition for realizing low power consumption while ensuring an operation margin can be selected.

With a configuration in which the PSNC signal and the PCECNT signal are supplied from the outside of the semiconductor memory device, an optimal condition can be selected at a time of memory test in a simple manner.

Moreover, if at a time of memory test, state change among the above-described three states is performed using a test time mode setting means, the PSNC signal and the PCECNT signal do not have to be separately supplied as individual externally input signals.

Furthermore, if state change of source lines among the three states can be performed using vias in a contact layer based on which a value of output data is determined to be 0 or 1, the state change can be done at a time when a program is performed. Accordingly, mask costs and a design time can be reduced.

Fourth Embodiment

Figure 6:
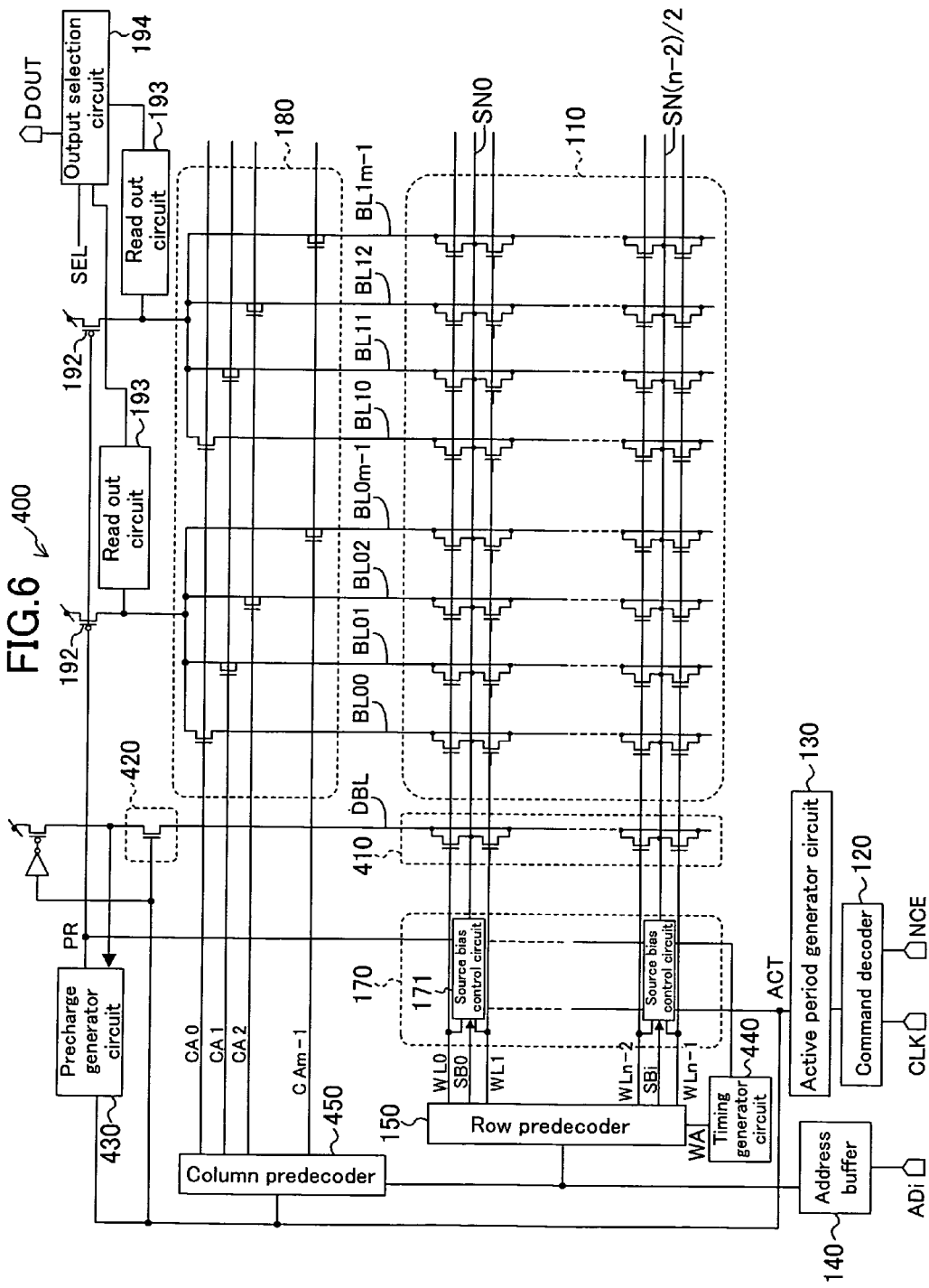
FIG. 6 is a block diagram illustrating a configuration of a semiconductor memory device according to a fourth embodiment of the present invention.

FIG. 6 is a block diagram illustrating a configuration of a semiconductor memory device 400 according to a fourth embodiment of the present invention. The semiconductor memory device 400 is an example of a semiconductor memory device in which a period for potential control for source lines is controlled according to a capacity of a memory cell. The semiconductor memory device 400 includes a precharge generator circuit 430, instead of the precharge generator circuit 191 of the semiconductor memory device 100 of the first embodiment. The semiconductor memory device 400 has a configuration obtained by adding a dummy memory cell array 410, a column switch 420 and a timing generator circuit 440 to the semiconductor memory device 100 of the first embodiment. In FIG. 6, a column predecoder 450, which is omitted in each of the forgoing embodiments, is illustrated.

The dummy memory cell array 410 is a memory cell array including ones of memory cells 111 located in a single column. Ones of the memory cells 111 located in the dummy memory cell array 410 do not store data. In the dummy memory cell array 410, a bit line DBL is provided.

The column switch 420 precharges the bit line DBL when a memory activation signal ACT becomes a High level.

The precharge generator circuit 430 activates a precharge signal PR only in a period (precharge generation period) in which the bit line DBL is precharged. Herein, as for the precharge signal PR, the state of being the Low level is also referred to as being "activated" and the state of being the High level is also referred to as being "reset" or being "deactivated".

Specifically, the precharge generator circuit 430 activates the precharge signal PR when the memory activation signal ACT becomes the High level and deactivates the precharge signal PR at a timing when a potential (precharge level) of the bit line DBL exceeds a predetermined level.

The timing generator circuit 440 outputs a timing signal WA for outputting a precharge signal to a row predecoder 150 at a timing when the precharge signal PR is deactivated.

The column predecoder 450 generates column selection signals CA0 through CAm−1 for selecting one from bit lines according to an address indicated by an address signal ADi.

Figure 7:
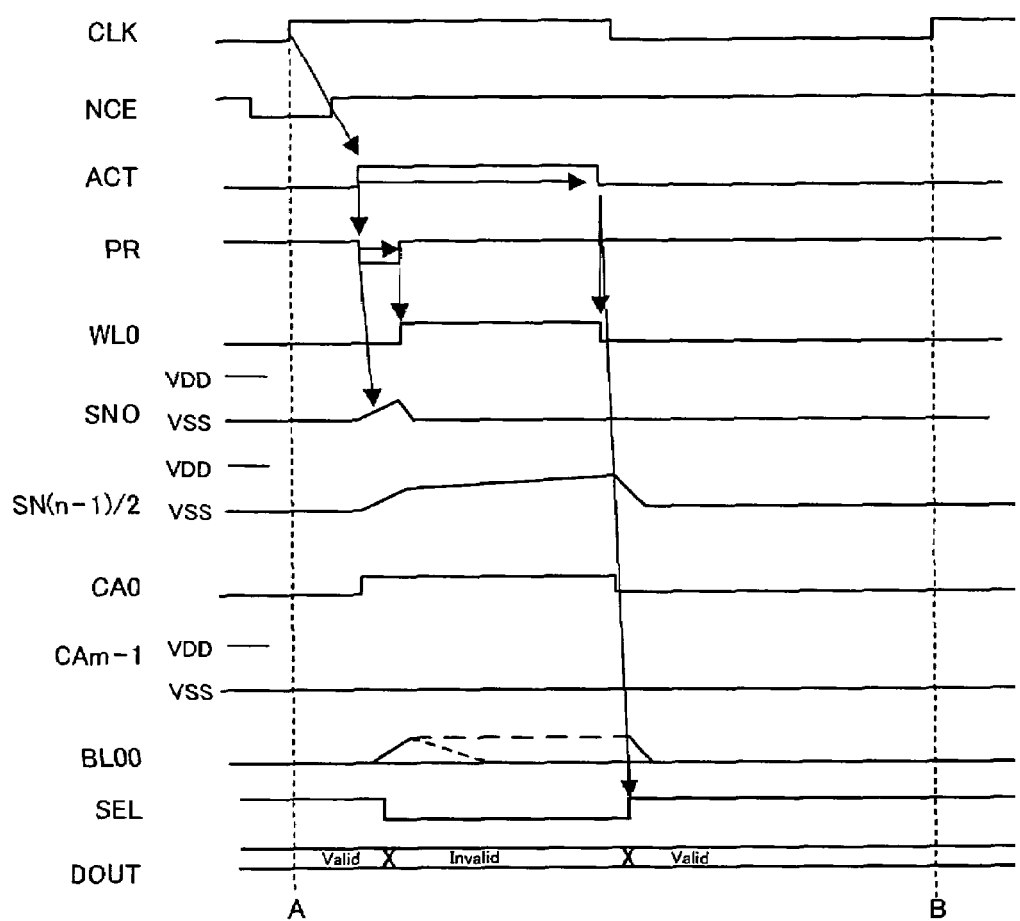
FIG. 7 is a timing chart according to the fourth embodiment of the present invention.

The operation of the semiconductor memory device 400 will be described with reference to a timing chart of FIG. 7.

When an external command NCE becomes the Low level at a timing A and accordingly a data read request is made, a memory activation signal ACT is generated by a command decoder 120 and an active period generator circuit 130.

The column switch 420 is activated by the memory activation signal ACT to the bit line DBL is precharged. Thus, a precharge signal PR is output from the precharge generator circuit 430.

At the same time, the address signal ADi is transmitted from the address buffer 140 to the row predecoder 150 and then to the column predecoder 450. Thus, for example, when the column selection signal CA0 is activated, each of the bit lines BL00 and BL10 is connected to an associated one of precharge transistors 192.

The precharge signal PR is activated, so that a source bias potential is supplied to all of source lines SN0 through SN(n−2)/2.

The precharge transistors 192 are turned ON by the precharge generator circuit 430 and the bit lines BL00 and BL10 selected by the column decoder 180 are precharged.

Thereafter, when the timing generation period using the dummy memory cell array 410 is completed, the precharge signal PR is automatically reset. When the precharge signal PR is reset, the timing signal WA is output from the timing generator circuit 440 and one of word lines connected to one of the memory cells 111 which is to be read out (for example, a word line WL0) is activated by the row predecoder 150 and then becomes the High level. This is a start of an active period in which an internal operation of the semiconductor memory device is activated. When the word line WL0 is activated, an associated one of the source line, i.e., the source line SN0 becomes the VSS level. Meanwhile, the other ones of the source lines maintain the source bias potential.

When the word line WL0 is activated, data of the read-out target one of the memory cells 111 is output from each of the bit lines BL00 and BL10. Then, when the memory activation signal ACT rises and is activated, all signals are deactivated and then an output selection signal SEL is activated. Thus, data output to one of the bit line BL00 and BL10 is output as data output DOUT from the output selection circuit 194.

As has been described, according to this embodiment, source lines are set to be the source bias potential in a precharge period, so that operation problems due to an OFF leakage current can be solved.

If many source lines are operated, current consumption is increased. Accordingly, a voltage drop is caused and therefore it is concerned that the voltage drop leads reduction in operation margin. However, by performing operations of many source lines in a precharge period, influences on a memory operation margin can be minimized.

Also, in an active period, the source bias potential is supplied to one of source lines which are not connected to read-out target one of memory cells. This eliminates a concern that unwanted data is read out from one of bit lines to which data read is performed due to an OFF leakage current.

To generate a period in which bit lines are precharged, dummy memory cells which have the same structure as normal memory cells but do not store data are used. Thus, a precharge period in which bit lines are precharged can be set to have a necessary length of time in a simple manner.

When a memory capacity is changed in the bit line direction, this embodiment is characterized in that with use of the above-described timing generation method using bit lines, timing setting can be performed in a very simple manner.

In the dummy memory cell array 410, a load carrying capacity of each of bit lines may be adjusted, for example, by connecting all or part of the memory cells 111 to respective bit lines, or disconnecting all of the memory cells 111 from respective bit lines. Thus, even if a length of the bit line DBL can not be changed, a precharge period can be adjusted.

When the dummy memory cell array 410 is provided with an output as a unit (i.e., per a memory cell array corresponding to a minimum number of bit lines included a single output selection circuit), for example, one of bit lines DBL in an output is connected to all of memory cells therein and another one of the bit lines DBL in another output is not connected to any one of memory cells, or like setting is made. Thus, according a difference in load carrying capacity among the bit lines DBL, timing control can be performed with an output as a unit. Connection or disconnection between one of bit lines and corresponding memory cells is determined using a contact layer based on which a value of output data is determined to be 0 or 1. Thus, a precharge period can be adjusted without adding any extra mask cost.

Figure 8:
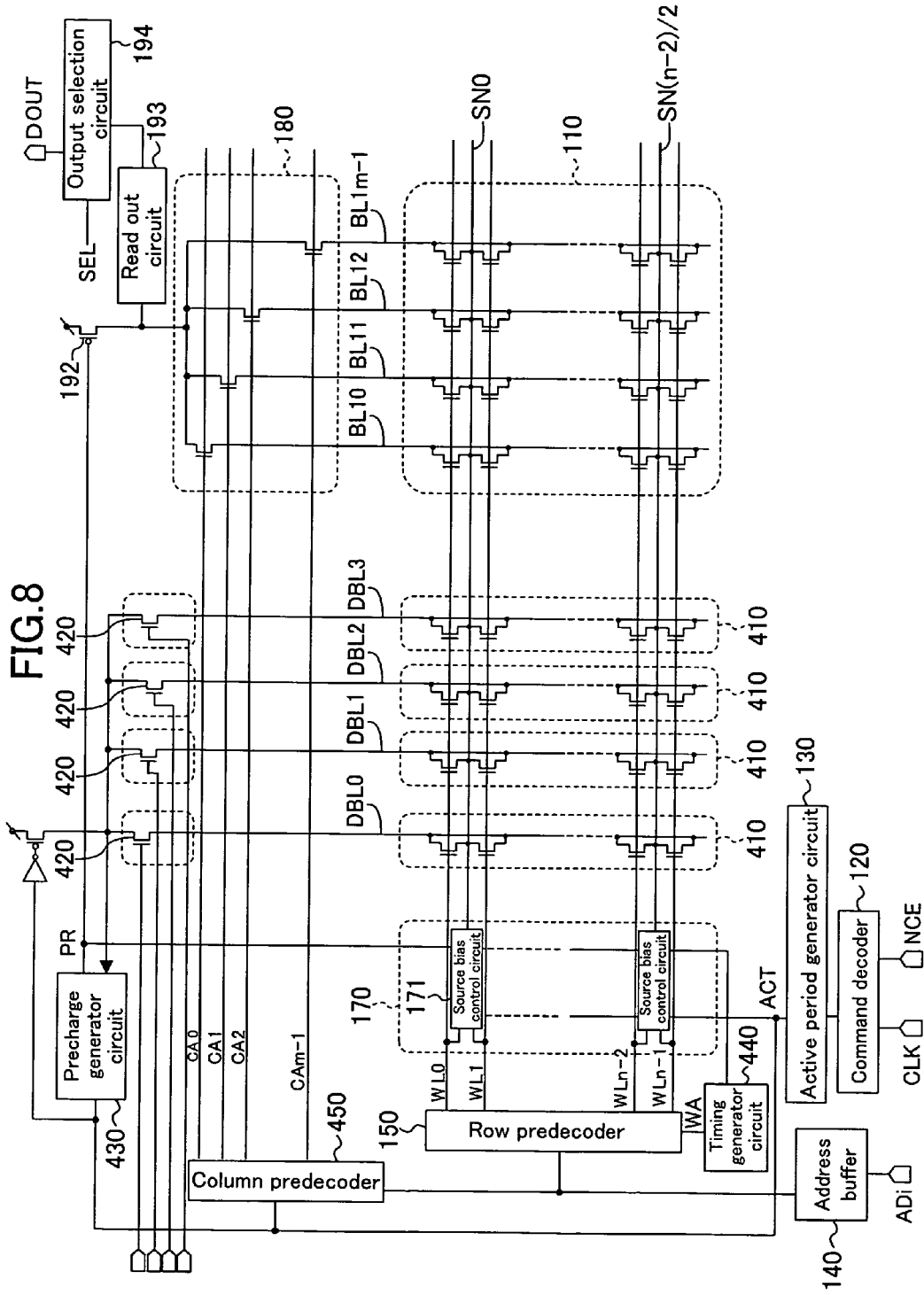
FIG. 8 is a block diagram illustrating a configuration of a semiconductor memory device according to a modified example of the fourth embodiment of the present invention.

As shown in FIG. 8, the semiconductor memory device 400 may have a configuration in which a plurality of pairs of a dummy memory array 410 and a column switch 420 are provided and transistor sizes of the column switches 420 differ among different column switches 420 so that a switching capability (a resistance value of a switch) differs among the column switches 420. Thus, a precharge period can be controlled not only by a load carrying capacity of each bit line but also a switching capability of the dummy memory cell array 410.

To fix a precharge period to a certain time length, for example, gate terminals in the dummy memory cell arrays 410 are fixed to a predetermined potential using the contact layer based on which a value of output data is determined to be 0 or 1. Thus, a precharge period can be fixed without adding extra mask costs. A pair of a dummy memory cell array 410 and a column switch 420 which is to be adopted may be changed not only using the contact layer but also, for example, using an interconnect layer or a device such as a fuse.

Moreover, as shown in FIG. 8, a control signal may be supplied to respective gate terminals of the column switches 420 from the outside, so that change of a precharge period can be externally performed. Thus, the relationship between optimal evaluation of a precharge period generated by a dummy memory array can be obtained to perform evaluation. That is, reduction in memory evaluation time and optimal timing control can be realized. Furthermore, a precharge period can be changed after fabrication, so that a yield can be improved.

Fifth Embodiment

Figure 9:
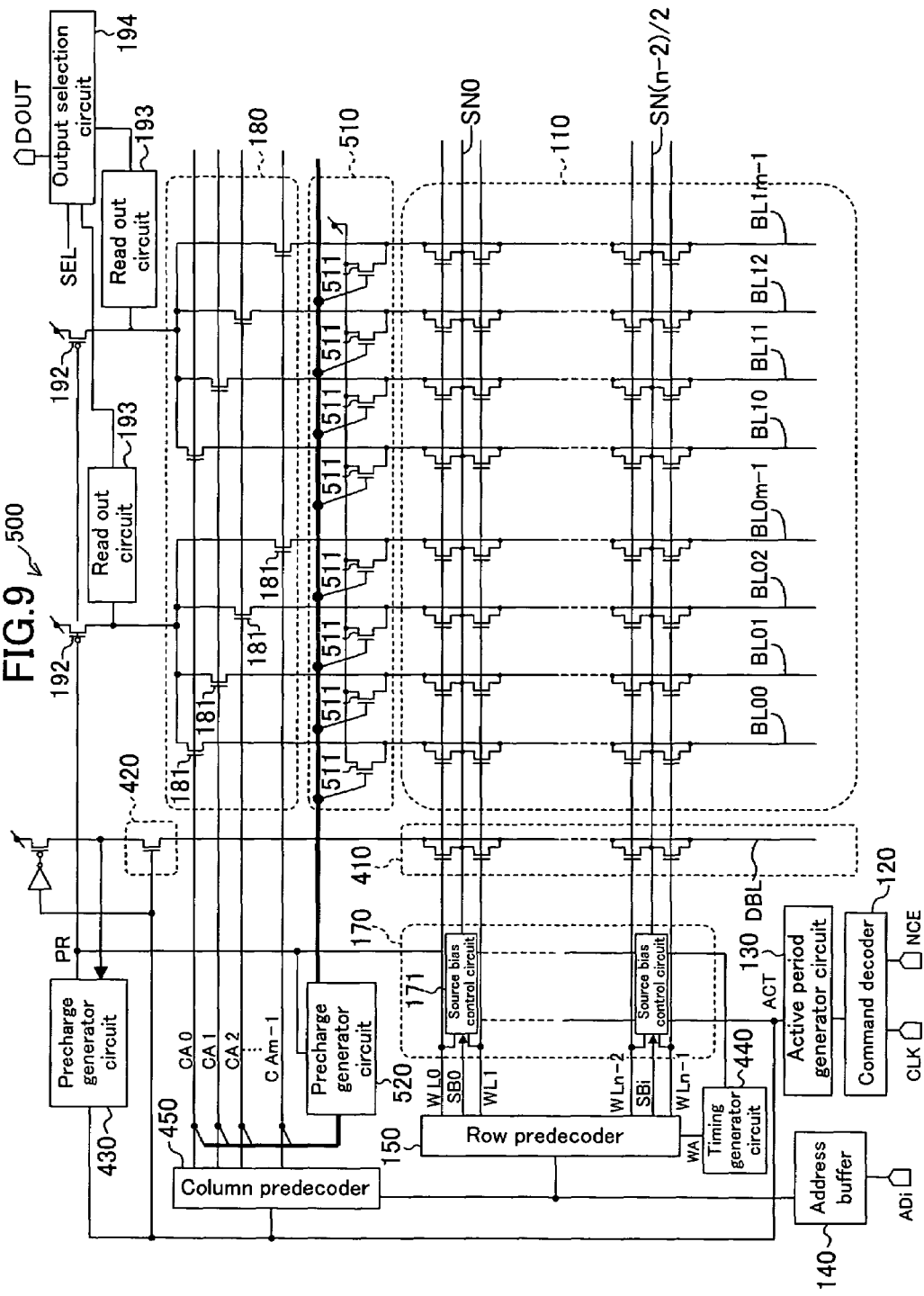
FIG. 9 is a block diagram illustrating a configuration of a semiconductor memory device according to a fifth embodiment of the present invention.
Figure 10:
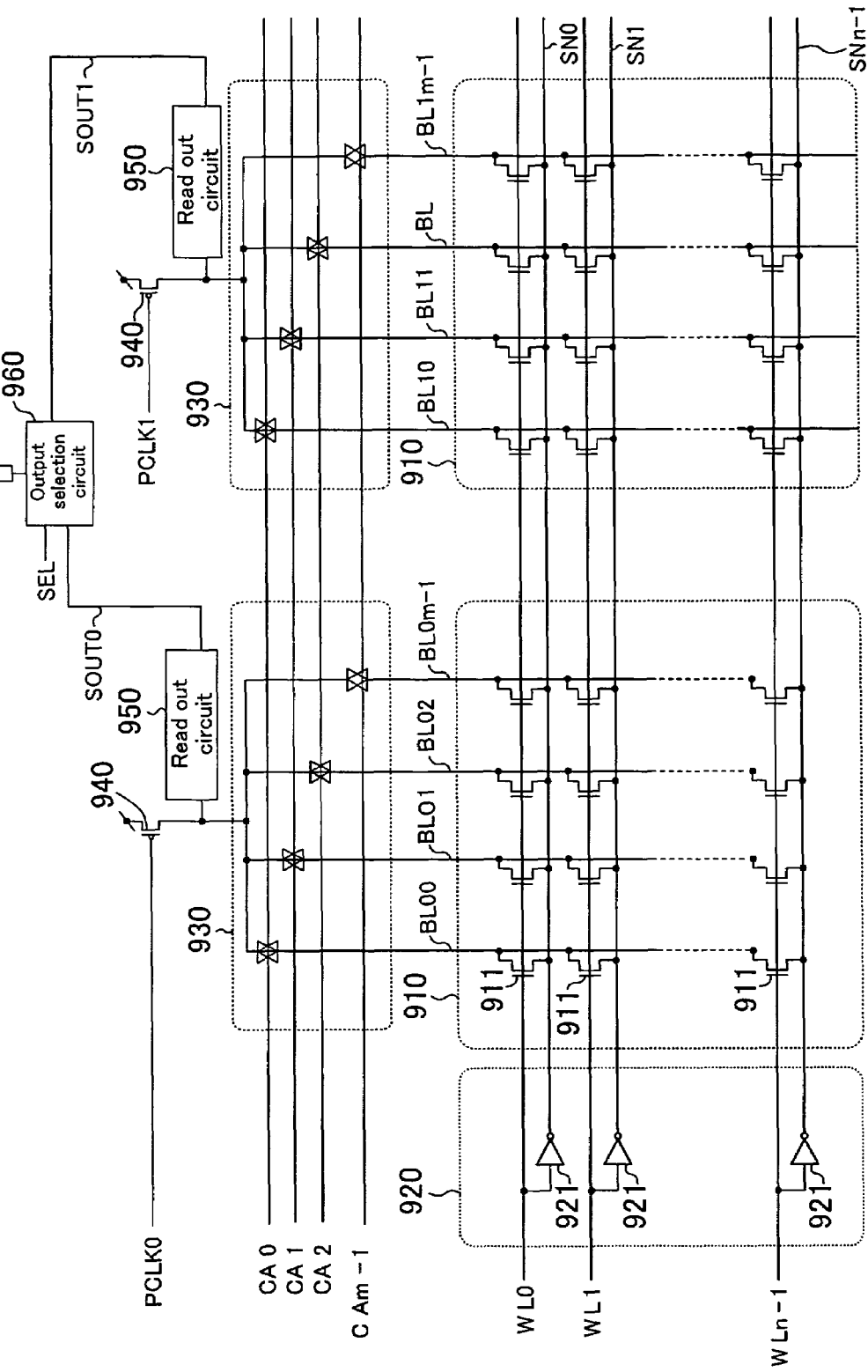
FIG. 10 is a block diagram illustrating a configuration of a known semiconductor memory device.
Figure 11:
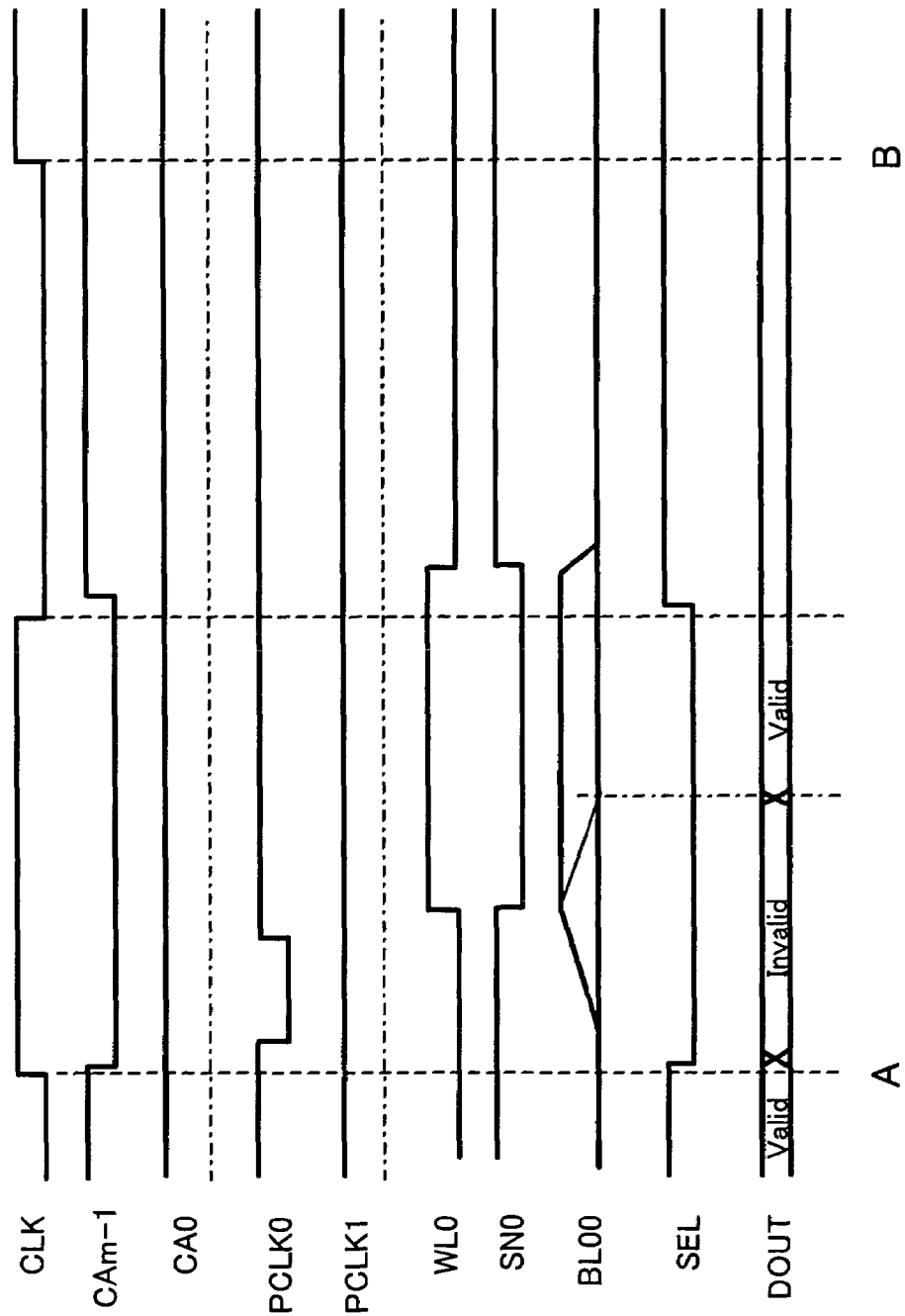
FIG. 11 is a timing chart for the known semiconductor memory device.

FIG. 9 is a block diagram illustrating a configuration of a semiconductor memory device 500 according to a fifth embodiment of the present invention. The semiconductor memory device 500 is an example of a semiconductor memory device in which precharge can be performed at higher speed, for example, compared to the semiconductor memory device 400 of the fourth embodiment. Specifically, the semiconductor memory device 500 has a configuration obtained by adding a bit line precharge circuit 510 and a precharge control circuit 520 to the semiconductor memory device 400.

The bit line precharge circuit 510 includes precharge transistors provided so as to correspond to bit lines, respectively. The bit line precharge circuit 510 is arranged between the column decoder 180 and the memory cell array 110.

When a precharge signal PR is activated, the precharge control circuit 520 turns ON one of precharge transistors 511 according to column selection signals CA0 through CAm−1, thereby precharging selected one of the bit lines.

In the semiconductor memory device 500, when bit lines are precharged, the bit lines are precharged by potentials supplied through respective precharge transistors 192 via respective column switches 181 turned ON by the column predecoder 450 and also precharged by potentials supplied through the precharge transistors 511 turned ON by the precharge control circuit 520.

For example, assume that the length of the bit lines is increased and its load carrying capacity is increased. Even if the capability of the column switches is increased, the precharge speed at which precharge of the bit lines via the respective column switches 181 is determined according to the capability of the respective column switches. Therefore, in such a case, a circuit area is increased to increase the precharge speed.

However, as described above, according to this embodiment, the bit line precharge circuit 510 is arranged so that the bit lines are precharged not via the column decoder 180. Thus, reduction in operation speed due to an ON resistance of the column switch 181 can be suppressed. That is, according to this embodiment, high speed and effective precharge can be performed in each small-sized transistor.

According to this embodiment, with application of a theory about a precharge signal PR and a column selection signal, the bit lines are selectively precharged. Thus, this embodiment is advantageous in terms of power consumption, compared to the case where the capability of the column switches 181 is merely improved.

For the column switches 181 and the precharge transistors 511, the same type of transistors (i.e., n-channel transistors) are used. Thus, for the column switches 181 and the precharge transistors 511 have the same tendency for variations in transistor characteristics caused in processing. For example, in the semiconductor memory device 500, even if variation in the capability is totally different between n-channel transistors and p-channel transistors, influences resulting from the difference is not significant and a stable precharge operation can be performed. The column switches 181 and the precharge transistors 511 only have to be formed of transistors of the same type. Therefore, when each of the column switches 181 and the precharge transistors 511 is formed of a p-channel transistor, the same effect can be achieved.

If precharge potentials supplied from the column switches 181 are set to be a VDD-Vtn (Vtn is a threshold potential of an n-channel transistor), precharge by a lower potential by Vtn can be performed, so that not only power consumption can be suppressed but also data can be read out from one of the bit lines at high speed when "0" data is read.

If a threshold potential of each of the column switches 181 and the precharge transistors 511 is set to be higher than a threshold potential of each of other transistors, a precharge voltage can be further reduced. Thus, in addition to suppression of power consumption, increase in "0" data read out and reduction in time for pulling the bit lines back to the VSS level can be achieved. Therefore, this embodiment is effective for reduction in data access time.

Levels (i.e., High level and Low level) of each signal and the correlation with their respective meanings have been described only for the purpose of illustrating examples and thus the present invention is not limited to those examples.

The components of the semiconductor memory devices described in each of the above-described embodiments and the modified examples may be provided in various different combinations within the limits of theoretical possibility.

As has been described, a semiconductor memory device according to the present invention has the effect of reducing power consumption in a stand-by period and in an operation period. Therefore, the present invention is useful as a circuit technique or the like for achieving increase in size and reduction in power consumption for a memory cell array in a semiconductor memory device such as a mask ROM and the like.

What is claimed is:

1. A semiconductor memory device which includes a memory cell array in which memory cells are arranged in a matrix, each said memory cell being formed of a single transistor, the semiconductor memory device comprising:
   a plurality of word lines provided so as to correspond to rows in the matrix, respectively, each said word line being connected in common to respective gate terminals of transistors located in an associated one of the rows;
   a plurality of bit lines provided so as to correspond to columns in the matrix, respectively, each said bit line being connected to at least one of respective drain terminals of transistors located in an associated one of the columns;
   a plurality of source lines provided so that each said source line corresponds to every adjacent two rows in the matrix and is connected in common to respective source terminals of transistors located in the two rows;
   a plurality of source bias control circuits for controlling, in an active period in which an operation of reading data from the memory cells, according to a row selection signal for selecting one or more of the source lines which are to be controlled, one or more of the source lines which are not connected to one of the memory cells which is to be read out to be in a state where a source bias potential is higher than a ground potential and lower than a power supply potential; and
   a source line selection circuit for selecting said one of the source lines which is to be read out and generating the row selection signal.

2. The semiconductor memory device of claim 1, wherein each said the source bias control circuit is configured so as to selectively perform control of the source lines by a predecode signal that is the row selection signal.

3. The semiconductor memory device of claim 1, further comprising a temperature detector circuit for detecting change in temperature of the semiconductor memory device, wherein the source line selection circuit is configured so as to select, according to the change in temperature detected by the temperature detector circuit, said one or more of the source lines which are to be controlled.

4. The semiconductor memory device of claim 1, wherein the source line selection circuit is configured so as to select, according to control externally performed from the outside of the semiconductor memory device, said one or more of the source lines which are to be controlled.

5. The semiconductor memory device of claim 1, further comprising a plurality of source pull down drivers for pulling, when one or more of the source lines to which the source bias potential is supplied are pulled back to the ground potential, one or more of the source lines which are to be pulled back to the ground potential, wherein the source pull down drivers are dispersedly arranged in a word line direction in the memory cell array.

6. The semiconductor memory device of claim 5, wherein the source pull down drivers are arranged so that one of the source pull down drivers is provided for each memory cell array corresponding to a minimum output unit for data read out from the memory cells.

7. The semiconductor memory device of claim 5, wherein each said source pull down driver is configured so as to pull down said one or more of the source lines according to respective potentials of the word lines.

8. The semiconductor memory device of claim 1, further comprising:

a plurality of bit line precharge circuits for precharging the bit lines according to a precharge signal indicating a period for precharge;

a command decoder circuit for outputting, at a timing corresponding to a memory access request from the outside of the semiconductor memory device, an active signal indicating an active period in which the semiconductor memory device is in an operation of reading out data from one of the memory cells and resetting the active signal at its own timing; and a precharge signal generator circuit for generating the precharge signal, wherein each said source bias control circuit is configured so as to control, in the precharge period indicated by the precharge signal or in the active period indicated by the active signal, said one or more of the source lines which are not connected to said one of the memory cells which is to be read out to be in the state where the source bias potential is supplied.

9. The semiconductor memory device of claim 8, further comprising:

a dummy memory cell array including ones of the memory cells located in a single column;

a dummy bit line used for connecting respective drain terminals of transistors constituting said ones of the memory cells, respectively, in the dummy cell array; and a dummy precharge circuit for precharging the dummy bit line, wherein the precharge signal generator circuit is configured so as to reset the precharge signal when a potential of the dummy bit line exceeds a predetermined level.

10. The semiconductor memory device of claim 9, wherein the dummy memory cell array is provided for each memory cell array corresponding to a minimum output unit for data read out from the memory cells, and wherein a load carrying capacity of the dummy bit line is adjusted according to whether or not at least one of the memory cells is connected to the dummy bit line or whether or not all of the memory cells are connected to the dummy bit line.

11. The semiconductor memory device of claim 9, wherein a value of data to be stored in each said the memory cell is determined on the basis of whether or not each said memory cell is connected to one of the bit lines to which the respective drain terminals of transistors are connected, and wherein the dummy memory cell array is configured so that when a contact layer based on which the value of data is determined is formed, the number of the dummy memory cell array and the number of ones of the memory cells which are to be connected to the dummy bit line in the dummy memory cell array are set.

12. The semiconductor memory device of claim 10, wherein a value of data to be stored in each said the memory cell is determined on the basis of whether or not each said memory cell is connected to one of the bit lines to which the respective drain terminals of transistors are connected, and wherein the dummy memory cell array is configured so that when a contact layer based on which the value of data is determined is formed, the number of the dummy memory cell array and the number of ones of the memory cells which are to be connected to the dummy bit line in the dummy memory cell array are set.

13. The semiconductor memory device of claim 9, wherein a plurality of pairs of the dummy memory cell array and the dummy precharge circuit are provided, and wherein each of the plurality of dummy precharge circuits in the pairs is configured so as to have a different precharge speed for precharging the dummy bit line.

14. The semiconductor memory device of claim 13, further comprising a plurality of column switch circuits for activating one of the pairs of the dummy memory cell array and the dummy precharge circuit according to control from the outside of the semiconductor memory device.

15. The semiconductor memory device of claim 13, wherein a value of data to be stored in each said the memory cell is determined on the basis of whether or not each said memory cell is connected to one of the bit lines to which the respective drain terminals of transistors are connected, and wherein the dummy memory cell array is configured so that when a contact layer based on which the value of data is determined is formed, one of the pairs of the dummy memory cell array and the dummy precharge circuit is activated.

16. The semiconductor memory device of claim 10, wherein a plurality of pairs of the dummy memory cell array and the dummy precharge circuit are provided, and wherein each of the plurality of dummy precharge circuits in the pairs is configured so as to have a different precharge speed for precharging the dummy bit line.

17. The semiconductor memory device of claim 16, further comprising a plurality of column switch circuits for activating one of the pairs of the dummy memory cell array and the dummy precharge circuit according to control from the outside of the semiconductor memory device.

18. The semiconductor memory device of claim 16, wherein a value of data to be stored in each said the memory cell is determined on the basis of whether or not each said memory cell is connected to one of the bit lines to which the respective drain terminals of transistors are connected, and wherein the dummy memory cell array is configured so that when a contact layer based on which the value of data is determined is formed, one of the pairs of the dummy memory cell array and the dummy precharge circuit is activated.

19. The semiconductor memory device of claim 1, further comprising:

a plurality of column switches for selecting one of the bit lines according to an address indicated by a received address signal;

a plurality of first precharge circuits for precharging the bit lines according to a precharge signal indicating a period for precharge by potentials supplied via the column switches, respectively;

a second precharge circuit for precharging the bit lines without potentials supplied via the column switches, respectively;

a command decoder circuit for outputting, at a timing corresponding to a memory access request from the outside of the semiconductor memory device, an active signal indicating an active period in which the semiconductor memory device is in an operation of reading out data from one of the memory cells and resetting the active signal at its own timing; and a precharge signal generator circuit for generating the precharge signal, wherein each said source bias control circuit is configured so as to control, in the precharge period indicated by the precharge signal or in the active period indicated by the active signal, said one or more of the source lines which are not connected to said one of the memory cells which is to be read out to be in the state where the source bias potential is supplied.

20. The semiconductor memory device of claim 19, wherein the column switches, the first precharge circuits and the second precharge circuit are formed of transistors of the same type.

21. The semiconductor memory device of claim 20, wherein each of the first precharge circuits and the second precharge circuit is configured so that precharge is performed by a lower potential than the power supply potential by a threshold potential of each said transistors forming the first precharge circuits and the second precharge circuit.

22. The semiconductor memory device of claim 21, wherein the threshold potential of each said transistors forming the column switches, the first precharge circuits and the second precharge circuit is higher than a threshold potential of a transistor used in some other circuit than the column switches, the first precharge circuits and the second precharge circuit in the semiconductor memory device.

23. The semiconductor memory device of claim 1 is a read only memory.

24. A semiconductor memory device which includes a memory cell array in which memory cells are arranged in a matrix, each said memory cell being formed of a single transistor, the semiconductor memory device comprising:

a plurality of word lines provided so as to correspond to rows in the matrix, respectively, each said word line being connected in common to respective gate terminals of transistors located in an associated one of the rows;

a plurality of bit lines provided so as to correspond to columns in the matrix, respectively, each said bit line being connected to at least one of respective drain terminals of transistors located in an associated one of the columns;

a plurality of source lines provided so that each said source line corresponds to every adjacent two rows in the matrix and is connected in common to respective source terminals of transistors located in the two rows;

a plurality of source bias control circuits for controlling, in an active period in which an operation of reading data from the memory cells, according to a row selection signal for selecting one or more of the source lines which are to be controlled, one or more of the source lines which are not connected to one of the memory cells which is to be read out to be in one of a state where a source bias potential is higher than a ground potential and lower than a power supply potential, a state where the ground potential is supplied and a high impedance state; and a source line selection circuit for selecting said one of the source lines which is to be read out and generating the row selection signal.

25. The semiconductor memory device of claim 24, wherein each said the source bias control circuit is configured so as to perform, according to a selection signal received from the outside of the semiconductor memory device, potential control to said one or more of the source lines to be in one of the three states.

26. The semiconductor memory device of claim 24, wherein a value of data to be stored in each said the memory cell is determined on the basis of whether or not each said memory cell is connected to one of the bit lines to which the respective drain terminals of transistors are connected, and wherein each said source bias control circuit is configured so that when a contact layer based on which the value of data is determined is formed, which one of the three states is determined as a target state of potential-control for said one or more of the source lines.

27. The semiconductor memory device of claim 24 is a read only memory.

* * * * *